United States Patent
Mimura et al.

(10) Patent No.: US 7,109,123 B2
(45) Date of Patent: Sep. 19, 2006

(54) SILICON ETCHING METHOD

(75) Inventors: Takanori Mimura, Nirasaki (JP);
Kazuya Nagaseki, Nirasaki (JP); Kenji Yamamoto, Nirasaki (JP); Katsumi Horiguchi, Nirasaki (JP); Yahui Huang, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 224 days.

(21) Appl. No.: 10/647,433

(22) Filed: Aug. 26, 2003

(65) Prior Publication Data

US 2004/0097090 A1    May 20, 2004

(30) Foreign Application Priority Data

Aug. 26, 2002   (JP)   ............................ 2002-245930

(51) Int. Cl.
*H01L 21/302* (2006.01)

(52) U.S. Cl. ...................... 438/711; 438/719; 438/728; 438/729

(58) Field of Classification Search ................ 438/711, 438/719, 728, 729
See application file for complete search history.

(56) References Cited

U.S. PATENT DOCUMENTS

| 4,793,897 | A | | 12/1988 | Dunfield et al. |
| 5,300,460 | A | * | 4/1994 | Collins et al. ............... 438/712 |
| 5,423,941 | A | * | 6/1995 | Komura et al. .............. 438/700 |
| 6,303,512 | B1 | | 10/2001 | Laermer et al. |
| 6,712,927 | B1 | * | 3/2004 | Grimbergen et al. .. 156/345.24 |

* cited by examiner

*Primary Examiner*—Nadine G. Norton
*Assistant Examiner*—Binh X. Tran
(74) *Attorney, Agent, or Firm*—Smith, Gambrell & Russell, LLP

(57) ABSTRACT

A Si etching method etches a Si wafer held on a susceptor placed in a processing vessel by a plasma-assisted etching process. A mixed etching gas prepared by mixing fluorosulfur gas, such as $SF_6$ gas, or fluorocarbon gas, $O_2$ gas and fluorosilicon gas, such as $SiF_4$ gas is supplied into the processing vessel. RF power of 40 MHz or above is applied to the mixed etching gas to generate a plasma. The Si wafer is etched with radicals and ions contained in the plasma.

17 Claims, 21 Drawing Sheets

FIG. 7

5μmφ TRENCH ETCH

| | ETCHING GAS FLOW RATE (sccm) | Si E/R (μm/min) | | SiO2 E/R (Å/min) | | Si ETCH SELECTIVITY | | UNDERCUT (μm/min) | | TAPER ANGLE (deg.) | |
|---|---|---|---|---|---|---|---|---|---|---|---|
| | | CEN-TER | EDGE | CEN-TER | EDGE | CEN-TER | EDGE | CEN-TER | EDGE | CEN-TER | EDGE |
| COMPA-RATIVE EXAMPLE a1 | SF6/O2 (400/75) | 19.8 | 19.5 | 6290 | 6498 | 31.4 | 30.0 | 0.42 | 0.20 | 88.99 | 89.02 |
| EXAMPLE A1 | SF6/O2/SiF4 (200/40/250) | 14.8 | 14.6 | 4636 | 4899 | 31.9 | 29.8 | 0.23 | 0.19 | – | – |
| EXAMPLE A2 | SF6/O2/SiF4 (200/80/250) | 15.4 | 15.1 | 3463 | 3847 | 44.4 | 39.2 | 0 | 0 | – | – |
| EXAMPLE A3 | SF6/O2/SiF4 (200/160/250) | 15.6 | 15.2 | 3377 | 3737 | 46.1 | 40.7 | 0 | 0 | 88.74 | 88.31 |
| EXAMPLE A4 | SF6/O2/SiF4 (400/80/250) | 17.2 | 16.9 | 5468 | 5192 | 31.5 | 32.6 | 0.37 | 0.33 | – | – |
| EXAMPLE A5 | SF6/O2/SiF4 (400/160/250) | 17.4 | 17.5 | 4581 | 4708 | 38.0 | 37.1 | 0 | 0 | – | – |
| EXAMPLE A6 | SF6/O2/SiF4 (600/240/250) | 17.5 | 17.6 | 5045 | 4920 | 34.7 | 35.7 | 0 | 0 | – | – |

[COMPARATIVE EXAMPLE a1]
(CENTER)    (EDGE)
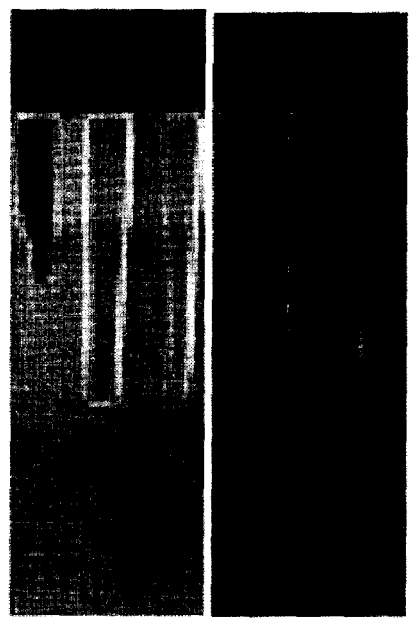
ENLARGED VIEW OF A PART NEAR THE MASK
(CENTER)    (EDGE)
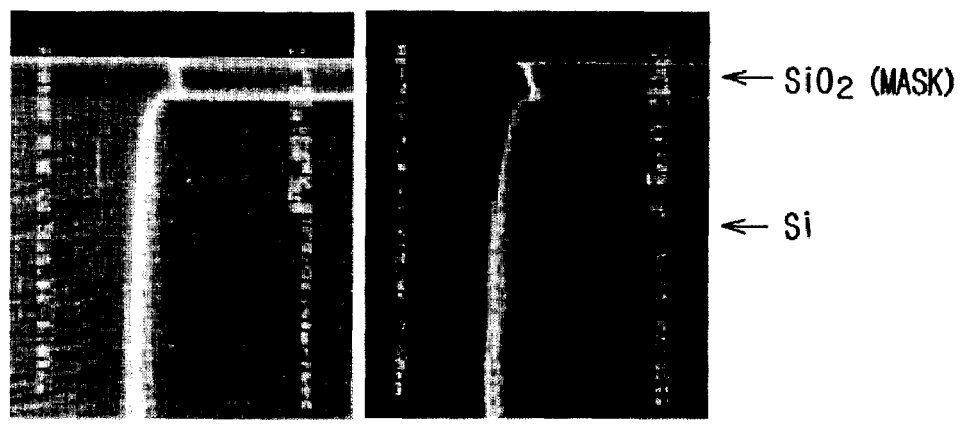
← $SiO_2$ (MASK)
← Si
F I G. 8

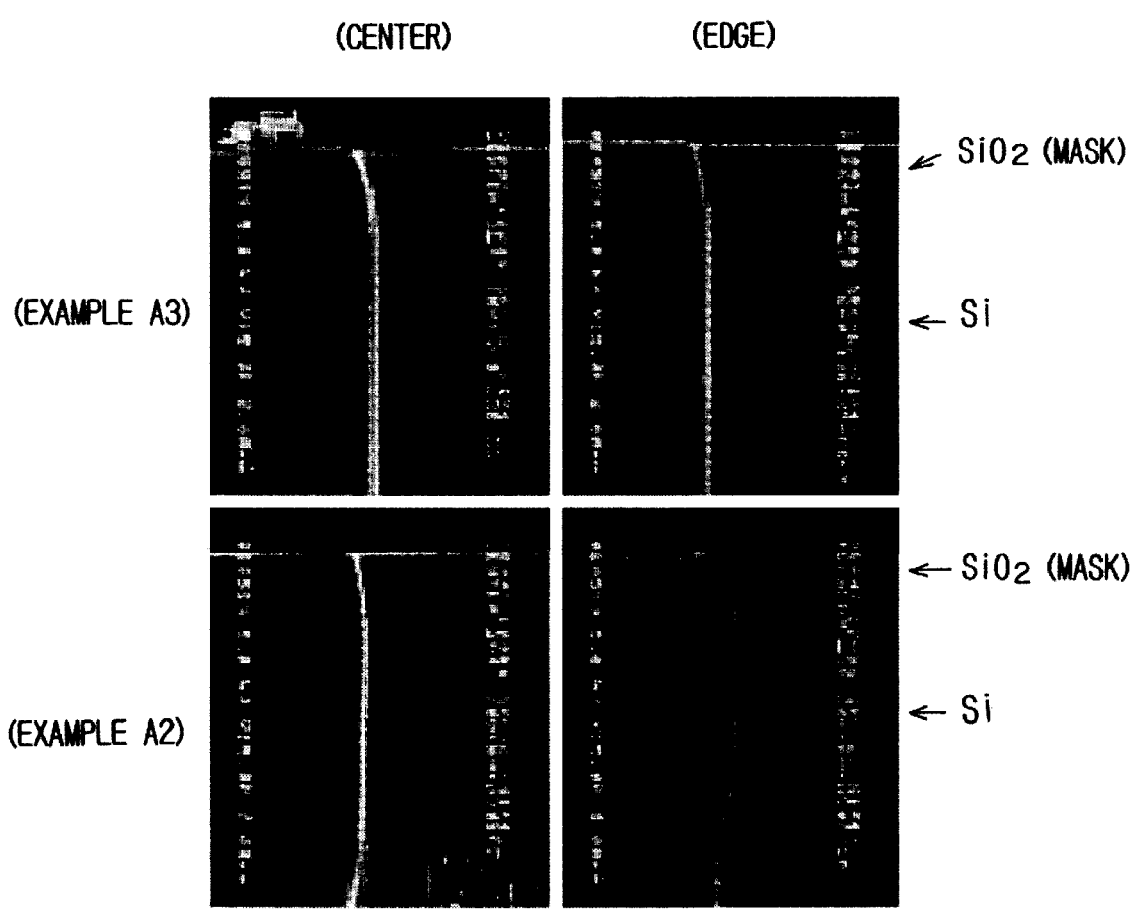
F I G. 10

A: UNDERCUT
θ: TAPER ANGLE

20μmφ TRENCH ETCH

| | ETCHING GAS FLOW RATE (sccm) | Si E/R (μm/min) | | SiO₂ E/R (Å/min) | | Si ETCH SELECTIVITY | | UNDERCUT (μm/min) | | TAPER ANGLE (deg.) | |
|---|---|---|---|---|---|---|---|---|---|---|---|
| | | CEN-TER | EDGE | CEN-TER | EDGE | CEN-TER | EDGE | CEN-TER | EDGE | CEN-TER | EDGE |
| COMPA-RATIVE EXAMPLE b1 | SF6/O2 (400/75) | 28.9 | 28.3 | 6290 | 6498 | 46.0 | 43.5 | 0.74 | 0.39 | 89.33 | 89.14 |
| EXAMPLE B1 | SF6/O2/SiF4 (200/40/250) | 20.9 | 21.0 | 4636 | 4899 | 45.1 | 42.9 | – | – | – | – |
| EXAMPLE B2 | SF6/O2/SiF4 (200/80/250) | 21.5 | 21.0 | 3463 | 3847 | 62.1 | 54.6 | 0 | 0 | – | – |
| EXAMPLE B3 | SF6/O2/SiF4 (200/160/250) | 15.4 | 14.2 | 3377 | 3737 | 45.5 | 38.1 | – | – | – | – |
| EXAMPLE B4 | SF6/O2/SiF4 (400/80/250) | 24.6 | 23.9 | 5468 | 5192 | 45.1 | 46.0 | – | – | – | – |
| EXAMPLE B5 | SF6/O2/SiF4 (400/160/250) | 23.2 | 23.3 | 4581 | 4708 | 50.6 | 49.5 | – | – | – | – |
| EXAMPLE B6 | SF6/O2/SiF4 (600/240/250) | 22.8 | 22.7 | 5045 | 4920 | 45.2 | 46.2 | – | – | – | – |

F I G. 12

[COMPARATIVE EXAMPLE b1]
(CENTER)   (EDGE)
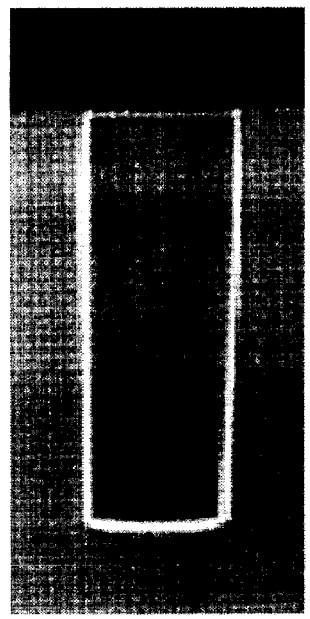 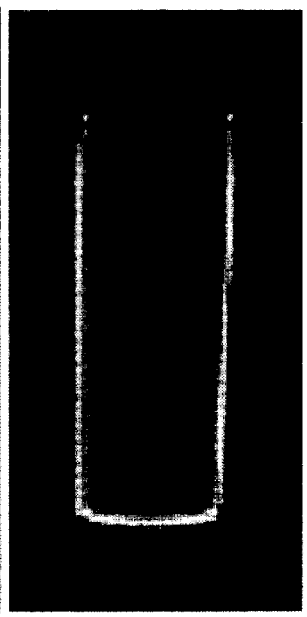
ENLARGED VIEW OF A PART NEAR THE MASK
(CENTER)   (EDGE)
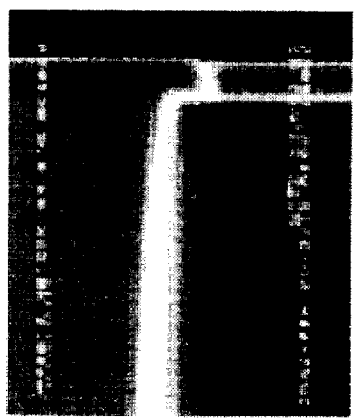 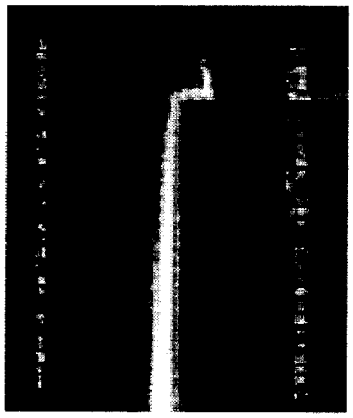
← SiO₂ (MASK)
← Si
F I G. 13

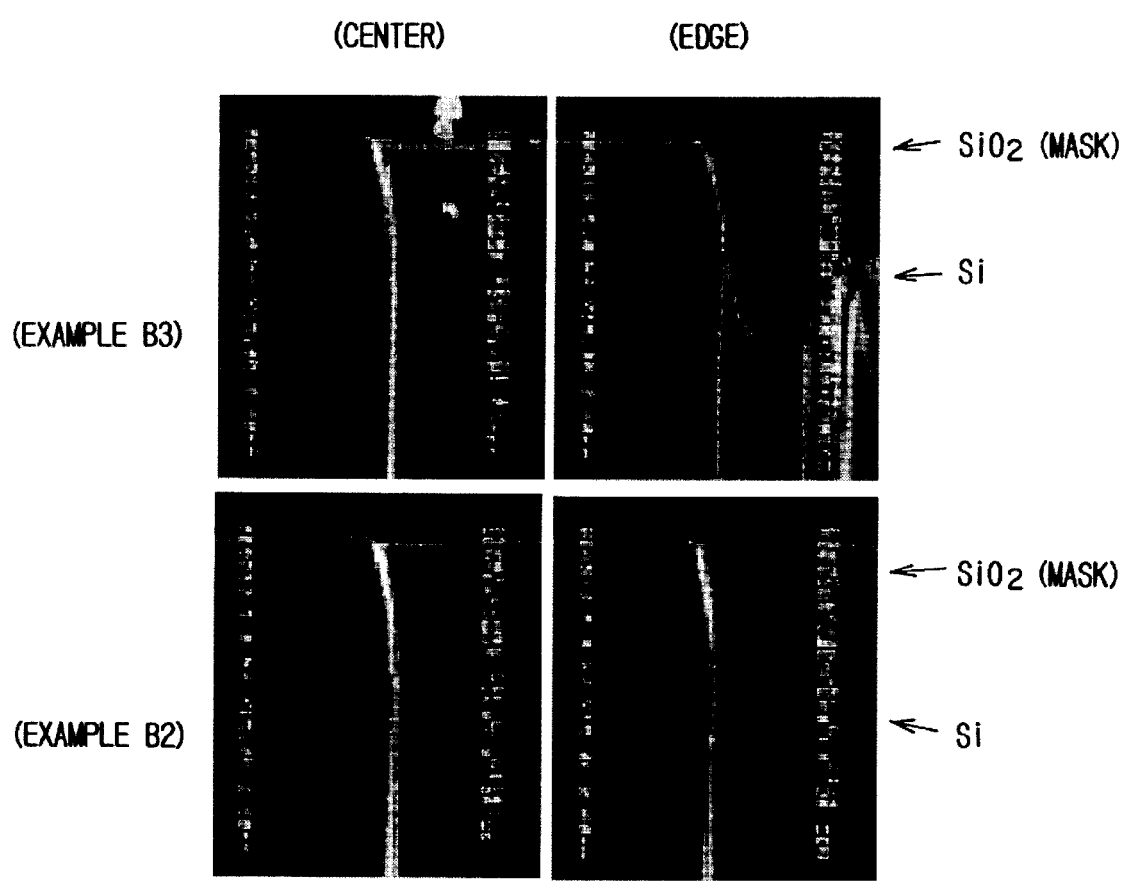
F I G. 15

5μmφ TRENCH ETCH

| | RF POWER (W) | PRES-SURE (mTorr) | Si E/R (μm/min) | | SiO2 E/R (Å/min) | | Si ETCH SELECTIVITY | | TAPER ANGLE (deg.) | |
|---|---|---|---|---|---|---|---|---|---|---|
| | | | CEN-TER | EDGE | CEN-TER | EDGE | CEN-TER | EDGE | CEN-TER | EDGE |
| EXAMPLE C1 | 1200 | 250 | 15.6 | 15.2 | 3377 | 3737 | 46.1 | 40.7 | 88.74 | 88.31 |
| EXAMPLE C2 | 1700 | 250 | 16.1 | 16.0 | 3663 | 4308 | 44.1 | 37.0 | 90.00 | 89.80 |
| EXAMPLE C3 | 2200 | 250 | 15.7 | 16.3 | 3513 | 3850 | 44.6 | 42.4 | 91.09 | — |
| EXAMPLE C4 | 2200 | 450 | 21.0 | 21.2 | 3717 | 4848 | 56.6 | 43.8 | 89.09 | 88.70 |

FIG. 16

20μmφ TRENCH ETCH

| | RF POWER (W) | PRESSURE (mTorr) | Si E/R (μm/min) | | SiO2 E/R (Å/min) | | Si ETCH SELECTIVITY | |
|---|---|---|---|---|---|---|---|---|
| | | | CENTER | EDGE | CENTER | EDGE | CENTER | EDGE |
| EXAMPLE D1 | 1200 | 250 | 15.4 | 14.2 | 3377 | 3737 | 45.5 | 38.1 |
| EXAMPLE D2 | 1700 | 250 | 18.7 | 17.2 | 3663 | 4308 | 51.1 | 39.9 |
| EXAMPLE D3 | 2200 | 250 | 20.4 | 17.9 | 3513 | 3850 | 58.1 | 46.4 |
| EXAMPLE D4 | 2200 | 450 | 28.6 | 26.3 | 3717 | 4848 | 76.9 | 54.2 |

FIG. 18

3μmφ TRENCH ETCH WITH RESIST MASK

| | RF POWER (w) | PRES- SURE (mTorr) | O₂ FLOW RATE (sccm) | Si E/R (μm/min) | | RESIST E/R (Å/min) | | Si ETCH SELEC- TIVITY | | NOTE |
|---|---|---|---|---|---|---|---|---|---|---|
| | | | | CEN- TER | EDGE | CEN- TER | EDGE | CEN- TER | EDGE | |
| EXAMPLE F1 | 450 | 130 | 120 | 6.5 | 6.6 | 4118 | 3016 | 15.7 | 21.8 | STEPS ARE FORMED ON SIDEWALLS OF TRENCHES |
| EXAMPLE F2 | 700 | 230 | 120 | 10.33 | 10.71 | 6348 | 5475 | 16.3 | 19.6 | |
| EXAMPLE F3 | 1000 | 350 | 120 | 12.48 | 13.08 | 8796 | 8538 | 14.2 | 15.3 | SLIGHTLY INVERSELY TAPERED |
| EXAMPLE F4 | 1000 | 350 | 180 | 15.72 | 16.02 | 8963 | 9144 | 17.5 | 17.5 | SLIGHTLY BOWING |

FIG. 20

1.2μm-WIDTH TRENCH ETCH

| | ETCHING GAS FLOW RATE (sccm) | PRES-SURE (mTorr) | RF POWER (W) | BACK PRESSURE (Torr) | | TIME (sec) | LOCA-TION | TRENCH LENGTH | Si ETCH SELEC-TIVITY (Si/SiO2) | Si E/R (μm/min) | TAPER ANGLE (deg) |
|---|---|---|---|---|---|---|---|---|---|---|---|
| | | | | CEN-TER | EDGE | | | | | | |
| COMPA-RATIVE EXAMPLE 1 | SF6/O2 (150/90) | 70 | 650 | 7 | 40 | 60 | CEN-TER | 1μm | 21.2 | 5.72 | 88.3 |
| | | | | | | | | 2μm | 22.4 | 6.05 | 87.7 |
| | | | | | | | | 10μm | 24.2 | 6.54 | 87.3 |
| | | | | | | | EDGE | 1μm | 31.9 | 6.30 | 86.9 |
| | | | | | | | | 2μm | 35.0 | 6.91 | 87.5 |
| | | | | | | | | 10μm | 37.0 | 7.30 | |
| COMPA-RATIVE EXAMPLE e2 | SF6/O2 (150/90) | 100 | 650 | 10 | 40 | 60 | CEN-TER | 1μm | 21.3 | 6.28 | 86.8 |
| | | | | | | | | 2μm | 24.4 | 7.19 | 86.7 |
| | | | | | | | | 10μm | 24.7 | 7.27 | |
| | | | | | | | EDGE | 1μm | 32.0 | 5.76 | 86.4 |
| | | | | | | | | 2μm | 36.7 | 6.60 | 86.5 |
| | | | | | | | | 10μm | 36.8 | 6.62 | |
| COMPA-RATIVE EXAMPLE e3 | SF6/O2 (150/90) | 70 | 500 | 15 | 40 | 60 | CEN-TER | 1μm | 21.0 | 4.84 | 85.9 |
| | | | | | | | | 2μm | 24.4 | 5.62 | 87.0 |
| | | | | | | | | 10μm | 24.8 | 5.71 | |
| | | | | | | | EDGE | 1μm | 35.5 | 4.61 | 85.7 |
| | | | | | | | | 2μm | 40.8 | 5.30 | |
| | | | | | | | | 10μm | 41.1 | 5.34 | |

FIG. 21

1.2μm-WIDTH TRENCH ETCH

| | ETCHING GAS FLOW RATE (sccm) | PRESSURE (mTorr) | RF POWER (W) | BACK PRESSURE (Torr) CENTER | BACK PRESSURE (Torr) EDGE | TIME (sec) | LOCATION | TRENCH LENGTH | Si ETCH SELECTIVITY (Si/SiO2) | Si E/R (μm/min) | TAPER ANGLE (deg) |
|---|---|---|---|---|---|---|---|---|---|---|---|
| EXAMPLE E1 | SF6/O2 / SiF4 (150/90 /50) | 70 | 650 | 15 | 40 | 60 | CENTER | 1μm | 20.5 | 5.38 | 87.7 |
| | | | | | | | | 2μm | 22.9 | 6.01 | 87.7 |
| | | | | | | | | 10μm | 24.4 | 6.40 | 87.7 |
| | | | | | | | EDGE | 1μm | 31.9 | 6.14 | 87.8 |
| | | | | | | | | 2μm | 34.3 | 6.59 | 87.6 |
| | | | | | | | | 10μm | 36.3 | 6.97 | 87.1 |
| EXAMPLE E2 | SF6/O2 / SiF4 (150/90 /50) | 170 | 1400 | 15 | 40 | 30 | CENTER | 1μm | 23.4 | 10.69 | 86.9 |
| | | | | | | | | 2μm | 25.3 | 11.56 | 87.3 |
| | | | | | | | | 10μm | 26.3 | 12.04 | 87.1 |
| | | | | | | | EDGE | 1μm | 30.7 | 11.70 | 87.3 |
| | | | | | | | | 2μm | 33.0 | 12.61 | 87.1 |
| | | | | | | | | 10μm | 34.5 | 13.17 | 87.3 |
| EXAMPLE E3 | SF6/O2 / SiF4 (150/90 /50) | 250 | 2000 | 15 | 40 | 30 | CENTER | 1μm | 23.1 | 13.05 | 87.1 |
| | | | | | | | | 2μm | 25.6 | 14.44 | 87.8 |
| | | | | | | | | 10μm | 26.8 | 15.13 | 87.1 |
| | | | | | | | EDGE | 1μm | 26.4 | 14.36 | 87.8 |
| | | | | | | | | 2μm | 28.9 | 15.71 | 87.8 |
| | | | | | | | | 10μm | 31.2 | 16.94 | |

FIG. 22

1.2μm-WIDTH TRENCH ETCH

| | ETCHING GAS FLOW RATE (sccm) | PRES-SURE (mTorr) | RF POWER (W) | BACK PRESSURE (Torr) CEN-TER | BACK PRESSURE (Torr) EDGE | TIME (sec) | LOCA-TION | TRENCH LENGTH | Si ETCH SELEC-TIVITY (Si/SiO2) | Si E/R (μm/min) | TAPER ANGLE (deg.) |
|---|---|---|---|---|---|---|---|---|---|---|---|
| EXAMPLE E4 | SF6/O2/SiF4 (150/90/350) | 170 | 1400 | 15 | 40 | 30 | CENTER | 1μm | 52.9 | 9.25 | 88.7 |
| | | | | | | | | 2μm | 56.8 | 9.95 | 88.8 |
| | | | | | | | | 10μm | 62.1 | 10.88 | 88.8 |
| | | | | | | | EDGE | 1μm | 57.7 | 10.00 | 88.6 |
| | | | | | | | | 2μm | 62.6 | 10.86 | |
| | | | | | | | | 10μm | 67.5 | 11.69 | 89.0 |
| EXAMPLE E5 | SF6/O2/SiF4 (150/90/350) | 170 | 1400 | 15 | 40 | 80 | CENTER | 1μm | 37.9 | 7.39 | 88.7 |
| | | | | | | | | 2μm | 43.8 | 8.54 | |
| | | | | | | | | 10μm | 47.0 | 9.16 | 88.4 |
| | | | | | | | EDGE | 1μm | 43.2 | 7.68 | 88.6 |
| | | | | | | | | 2μm | 50.7 | 9.02 | |
| | | | | | | | | 10μm | 54.8 | 9.75 | 88.5 |

FIG. 23

SILICON ETCHING METHOD

BACKGROUND OF THE INVENTION

1. Field of the Invention

The present invention relates to a silicon etching method, and more particularly, to a silicon etching method using a plasma.

2. Description of the Related Art

A trench etching that forms a groove-shaped trench for isolation of elements or a cylindrical trench for capacitors is a representative silicon (Si) etching. A trench etching method of forming deep trenches for deep trench isolation (DTI) and a trench etching method of forming trenches for memory cells and capacitors form trenches with widths in the range of about 0.8 to about 1.2 μm and depths in the range of about 5 to about 8 μm in a major surface of a Si substrate. Those trench etching methods are representative trench etching methods of forming trenches with large aspect ratios. Recent three-dimensional IC devices and micro electromechanical systems (MEMSs) require an etching method capable of forming wiring through holes and trenches with depths not smaller than 100 μm for mechanical structures in a Si substrate.

Most conventional Si etching methods use a $SF_6/O_2$ mixed gas as a reactive gas for producing a reactive plasma. A $SF_6$ gas derived plasma contains F atoms in a F atom density several times those of plasmas derived from other fluorinated gases, and S atoms of $SF_6$ prevents the oxidation of the surface of Si substrate and promotes Si etching. Thus, it is considered that $SF_6$ gas is an optimum etching gas for etching the Si substrate at a high etch rate. Oxygen gas ($O_2$ gas) reacts with Si of the Si substrat , forms oxide films ($SiO_x$ films) on sidewalls, and promotes vertical (anisotropic) etching.

The sidewall protecting effect of the $SF_6/O_2$ mixed gas in Si etching is not satisfactory. Consequently, undercuts or encroachments are liable to be formed in the side walls of the etched holes or grooves and it is difficult to achieve vertical (anisotropic) etching. Moreover, the $SF_6/O_2$ mixed gas is unsatisfactory in the etch selectivity of Si with respect to the masking material (hereinafter referred to as "Si etch selectivity"), and can etch in a limited depth.

In order to make up for the shortcomings of the $SF_6/O_2$ mixed gas, an etching method that performs an etching cycle using the $SF_6/O_2$ mixed gas and a deposition cycle using a $CF_x$ gas alternately has been proposed. However, processing efficiency or throughput of this etching method is low because etching does not progress during the deposition cycle.

SUMMARY OF THE INVENTION

The present invention has been made to solve those problems and it is therefore an object of the present invention to provide a Si etching method satisfactory in the Si-to-mask selectivity, and capable of carrying out improved anisotropic etching and of etching Si at a high etch rate.

In order to attain the objective, the present invention provides a method of etching a Si targat object or a workpiece, which is a Si substrate or a Si layer formed on a substrate, by using a plasma. The method including the steps of: placing the Si targat object, coated with a mask, in a processing vessel; supplying a mixed etching gas into the processing vessel, the etching gas containing fluorosulfur or fluorocarbon gas; $O_2$ gas and fluorosilicon gas; and applying first RF voltage having first frequency of 40 MHz or above to a first electrode to couple RF poweRFrom the first electrode to a second electrode in the processing vessel, thereby generating a plasma from the etching gases.

Si in the gas phase produced in a plasma reacts with $O_2$ molecules and oxygen radicals to deposit an oxide film (SiO film) on a mask and to reinforce protective films ($SiO_x$ films) coating sidewalls of the etched recesses (trenches, holes or the like). The oxide film deposited on the mask prevents the mask from being etched and thereby the Si etch selectivity is increased. The reinforcement of the protective films protecting the sidewalls is effective in preventing undercut and side etching and in promoting vertical etching. Fluorosilicon dissociates to produce F atoms, which promote etching in the direction of depth and thereby etching progresses at a high etch rate. Preferably, the fluorosilicon concentration of the mixed etching gas is 10% or above.

Preferably, $SF_6$ gas having a small S/F ratio, i.e., the ratio of the number of sulfur atoms to that of fluorine atoms is used as the fluorosulfur gas. However, $S_2F_{10}$ gas may be used.

Preferably, $CF_4$ gas having a small C/F ratio, i.e., the ratio of the number of carbon atoms to that of fluorine atoms is used as the fluorocarbon gas. However, $C_3F_8$ may be used.

Although $SiF_4$ is preferable is used as the fluorosilicon gas, $Si_2F_6$ may be used.

The Si etching method of the present invention may use a mask of any suitable material other than Si. Usually, the mask is formed by processing a silicon dioxide film, i.e., a film of an inorganic material, or a resist film, i.e., a film of an organic material.

Desirably, the Si etching method adjusts the flow rate of the etching gas properly according to the shape, the pattern or the dimensions of etched parts.

The Si etching method of the present invention uses ions and radicals contained in a plasma generated form the mixed etching gas. Preferably, the Si etching method of the present invention is carried out by a parallel-plate plasma-assisted etching system in view of achieving anisotropic etching at a high etch rate. More preferably, the Si etching method of the present invention is carried out by a magnetic-enhanced reactive ion etching (abbreviated to "RIE") system. In carrying out magnetic-enhanced RIE, radio-frequency (abbreviated to "RF") voltage may be applied to a first electrode or a susceptor supporting a Si substrate or a workpiece provided with a Si layer to couple RF power from the first electrode to a second electrode. The second electrode may be a shower head which is grounded. A higher magnetic flux density of a magnetic field represented by lines of magnetic force perpendicular to an electric field created in a space between parallel electrodes, i.e., a magnetic field parallel to the surfaces of the parallel electrodes, is more effective in producing a high-density plasma. Preferably, the magnetic flux density of the magnetic field is 170 G (Gauss) or above.

The RF power having a higher frequency is more effective in increasing the etch rate and the Si-to-mask selectivity. Preferably, the frequency of the RF voltage is 40 MHz or above. The magnitude of the RF power is an important etching condition that dominates etch rate, Si etch selectivity, degree of anisotropic etching and taper angle. The magnitude of the RF power may be determined according to the pattern of etched parts, the mixing ratios of the component gases of the mixed gas, and the process pressure.

In the event that the etching method forms fine, deep holes or narrow, deep trenches, it is preferable that second RF voltage having lower frequency, such as 3.2 MHz, may be applied (i.e., superimposed) to the first electrode simultaneously with the applying of the first RF voltage having higher frequency of 40 MHz or above.

The pressure in a processing vessel is an important etching condition that dominates the etching characteristic of the Si etching method of the present invention. An optimum pressure may be determined according to the pattern of etched parts, the mixing ratios of the components of the mixed gas, the magnitude of the RF power.

The temperature of the electrode or the susceptor supporting a workpiece affects the etching characteristic of the Si etching method. Decreasing the temperature results in the enhancement of vertical etch rate. Preferably, the electrode is at a low temperature in the range of −30° C. to 20° C. to prevent or suppress undercut efficiently.

More concretely, when parts of a Si substrate or a Si layer are etched to form holes with diameters of about 3 μm or below and depths of about 15 μm or below, or to form grooves with widths of about 3 μm or below and depths of about 15 μm or below, it is preferable that the flow rate ratio, (fluorosulfur or fluorocarbon)/O$^2$/(fluorosilicon) is in the range of 1/(0.6 to 0.67)/(0.33 to 2.33). Preferably, the RF power has a power flux density in the range of 1.5 to 6.4 W/cm$^2$ (watts/cm$^2$) and the pressure in the processing vessel is in the range of 50 to 250 millitorr.

When parts of a Si substrate or a Si layer are etched to form holes with diameters of about 3 μm or above and depths of about 20 μm or above, or to form grooves with widths of about 3 μm or above and depths of about 20 μm or above, it is preferable that the flow rate ratio, (fluorosulfur or fluorocarbon)/O$_2$/(fluorosilicon) is in the range of (0.8 to 2.4)/(0.16 to 0.96)/1.

In the event that the mask is a SiO$_2$ film, it is peferable that the RF power has a power flux density in the range of 6.8 to 12.5 W/cm$^2$, and the pressure in the processing vessel is in the range of 150 to 450 millitorr.

In the event that the mask is a resist film, it is peferable that the RF power has a power flux density in the range of 2.55 to 5.67 W/cm$^2$, and the pressure in the processing vessel is in the range of 150 to 450 millitorr.

BRIEF DESCRIPTION OF THE DRAWINGS

The above and other objects, features and advantages of the present invention will become more apparent from the following description taken in connection with the accompanying drawings, in which:

FIG. 7 is a table showing principal etching conditions and corresponding etching characteristics in the second Experiment;

FIG. 8 shows SEM photographs of sections of Si wafers etched by a Si etching method in Comparative example a1 in the second Experiment;

FIG. 10 is enlarged SEM photographs shown in FIGS. 8 and 9;

FIG. 12 is a table showing principal etching conditions and corresponding etching characteristics in the third Experiment;

FIG. 13 shows SEM photographs of sections of Si wafers etched by a Si etching method in Comparative example b1 in the third Experiment;

FIG. 15 shows enlarged SEM photographs of sections of Si wafers shown in FIGS. 13 and 14;

FIG. 16 is a table showing principal etching conditions and corresponding etching characteristics in the fourth Experiment;

FIG. 18 is a table showing principal etching conditions and corresponding etching characteristics in the fifth Experiment;

FIG. 20 is a table showing principal etching conditions and corresponding etching characteristics in the sixth Experiment; and FIGS. 21 to 23 are tables showing principal etching conditions and corresponding etching characteristics in the seventh Experiment.

DESCRIPTION OF THE PREFERRED EMBODIMENTS

Figure 1:
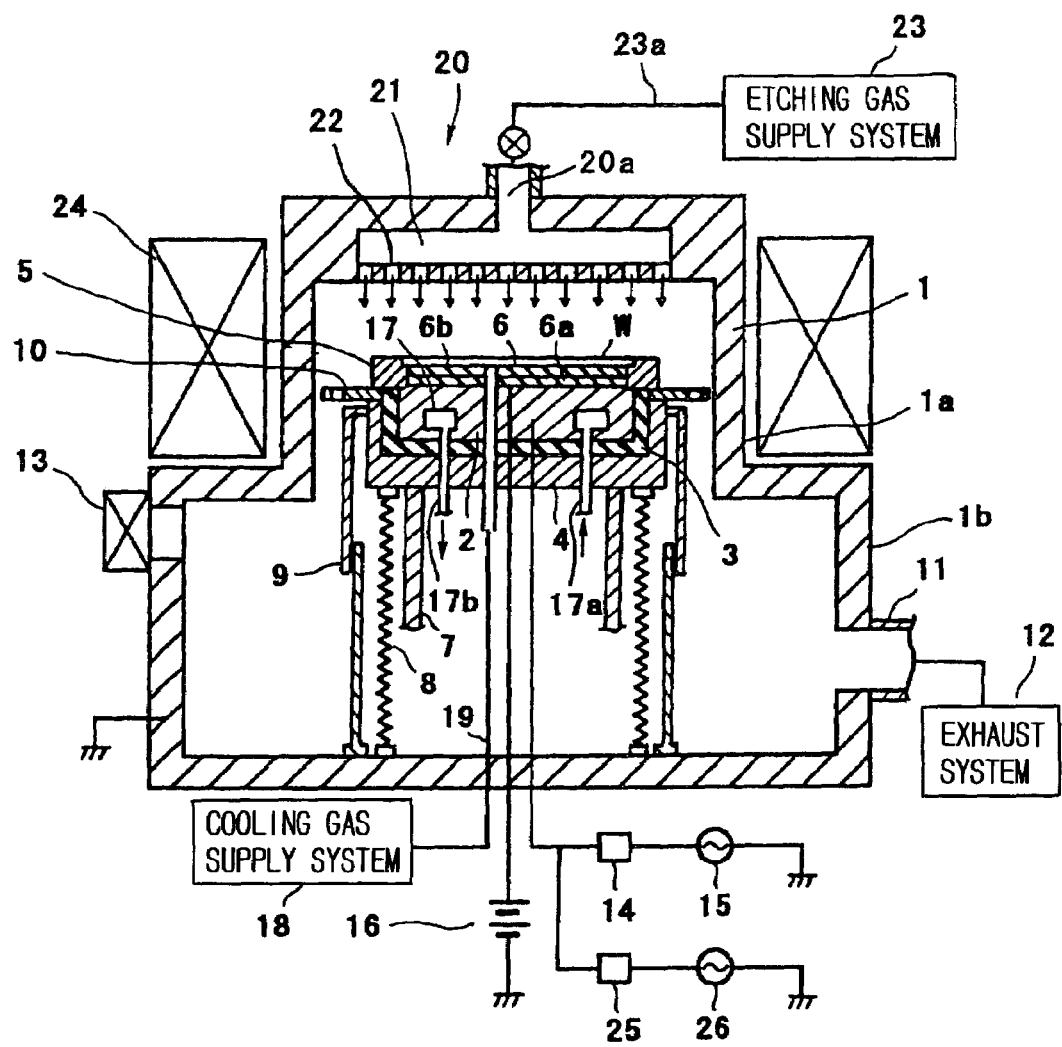
FIG. 1 is a schematic sectional view of a plasma-assisted etching system suitable for carrying out a Si etching method according to the present invention.

FIG. 1 shows a magnetically-enhanced plasma reactive ion etching (RIE) system suitable for carrying out a Si etching method according to the present invention. The system has a processing vessel 1 formed of a metal, such as aluminum or a stainless steel, and defining a processing chamber.

A susceptor 2 or a table for supporting a single-crystal Si wafer (i.e., a substrate or an object to be processed) thereon is placed in the processing vessel 1. The susceptor 2 formed of, for example, aluminum is supported on a conductive support member 4 and is electrically isolated from the support member 4 by an insulator 3. A focus ring 5 formed of, for example, quartz is placed on the upper surface of the susceptor 2. The susceptor 2 and the support member 4 can vertically be moved by a lifting mechanism including a ball screw 7. A drive unit, not shown, arranged below the support member 4 is covered with a stainless steel bellows 8. The bellows 8 is surrounded by a bellows cover 9. The lower surface of the focus ring 5 is in contact with a baffle plate 10 supported on the support member 4. The processing vessel 1 is grounded.

The processing vessel 1 has an upper part 1a of a small diameter and a lower part 1b of a big diameter. A discharge port 11 is formed in the sidewall of the lower part 1b of the processing vessel 1, and is connected to an exhaust system 12 including a vacuum pump by an exhaust pipe. The vacuum pump of the exhaust system 12 operates to evacuate the processing chamber (i.e., processing space) to a predetermined vacuum. A gate valve 13 is attached to the sidewall of the lower part 1b of the processing vessel 1 to open and close an opening through which a Si wafer W is carried into and out of the processing vessel 1.

The susceptor 2 is connected electrically to a first radio-frequency (RF) power source 15 through a matching device 14. The first RF power source 15 applies RF voltage of a predetermined radio frequency of, for example, 40 MHz to the susceptor 2 serving as a lower electrode, for plasma generation and reactive ion etching. A showerhead 20 serving as an upper electrode at a ground potential is arranged at a top part of the processing vessel 1. The first RF power source 15 supplies RF power to capacitively couple the susceptor 2 and the showerhead 20. The radio frequency of the RF voltage applied to the susceptor 2 may be higher than 40 MHz, and may be 60 MHz or 100 MHz, for example.

A second RF power source 26 is also electrically connected, through a matching device 25, to the susceptor 2 parallel to the first RF power source 15. The second RF power source 26 applies RF voltage to the susceptor 2. The frequency of RF voltage applied by the second RF power source 26 is, for example, 3.2 MHz, which is far lower than that of the RF voltage applied by the first RF power source 15.

The first and second RF power sources 14 and 26 are concurrently apply RF voltage to the susceptor 2, in other words, superimposed RF voltage is applied to the susceptor 2, when forming fine, deep holes or narrow, deep trenches by etching.

Arranged on a top part of the susceptor 2 is an electrostatic chuck 6, which holds a Si wafer W thereon by electrostatic attraction. The electrostatic chuck 6 includes a pair of insulating sheets 6b, and an electrode 6a formed of a conductive film sandwiched between the insulating sheets 6b. The electrode 6a is connected electrically to a dc power source 16. When a DC voltage is applied to the electrode 6a by the DC power source 16, the electrode 6a exerts a Coulomb force of attraction to the Si wafer W to hold the Si wafer W on the electrostatic chuck.

An annular coolant passage 17 is formed in the susceptor 2. The coolant passage 17 is connected to a chiller unit, not shown, by pipes 17a and 17b. The chiller unit circulates a coolant, such as cooling water, through the pipe 17a, the coolant passage 17 and the pipe 17b to maintain the Si wafer W held on the susceptor 2 at a processing temperature. It is preferable to maintain the susceptor 2 at a low temperature to enhance vertical (anisotropic) etching. The coolant of a temperature on the order of −30° C. may be used.

A cooling gas supply system 18 supplies a cooling gas, such as He gas, through a gas supply line 19 into a space between the upper surface of the electrostatic chuck 6 and the back surface of the Si wafer W. The gas supply system 18 controls individually gas pressures in spaces corresponding to a central part and a peripheral part of the Si wafer W to etch the surface of the Si wafer W uniformly.

The showerhead 20 has an upper wall provided with a gas inlet port 20a, and a lower wall facing the upper surface of the susceptor 2 and provided with gas discharge holes 22. The lower wall of the showerhead 20 is parallel to the upper surface of the susceptor 2. The showerhead 20 has a buffer chamber 21 extending between the upper and the lower wall thereof. The gas inlet port 20a is connected to an etching gas supply system 23 by a gas supply line 23a.

Figure 2:
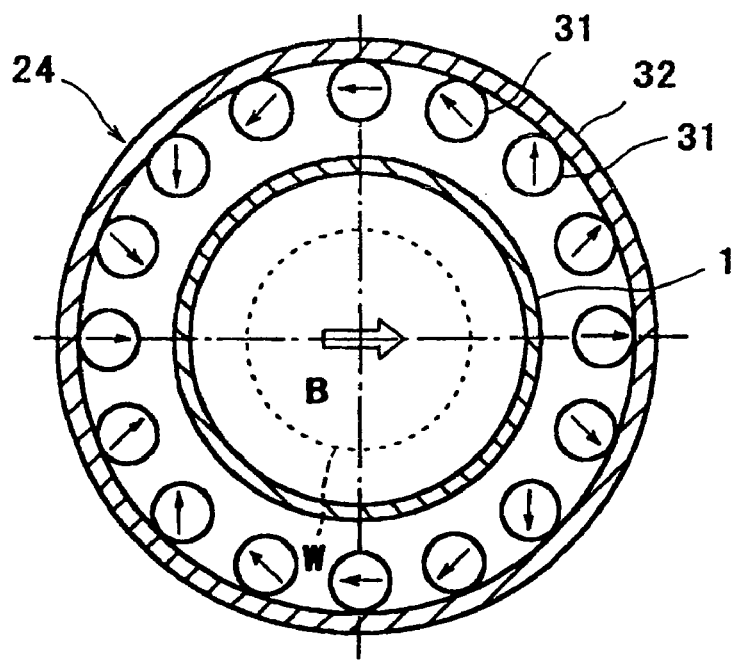
FIG. 2 is a typical cross-sectional view of a dipole magnetic ring included in the plasma-assisted etching system shown in FIG. 1.

A dipole magnetic ring 24 is disposed coaxially with the upper part 1a of the processing vessel 1 so as to surround the upper part 1a. As shown in FIG. 2, the dipole magnetic ring 24 includes an annular casing 32 of a magnetic material, and sixteen segmented, cylindrical, anisotropic magnets 31 arranged on a circle at equal angular intervals inside the casing 32. In FIG. 2, the arrows in circles representing the anisotropic magnets 31 indicate directions of magnetization. The anisotropic magnets 31 at different circumferential positions have different directions of magnetization gradually varying along the circumferential direction. The anisotropic magnets 31 create a uniform horizontal magnetic field B having single direction of magnetization.

Figure 3:
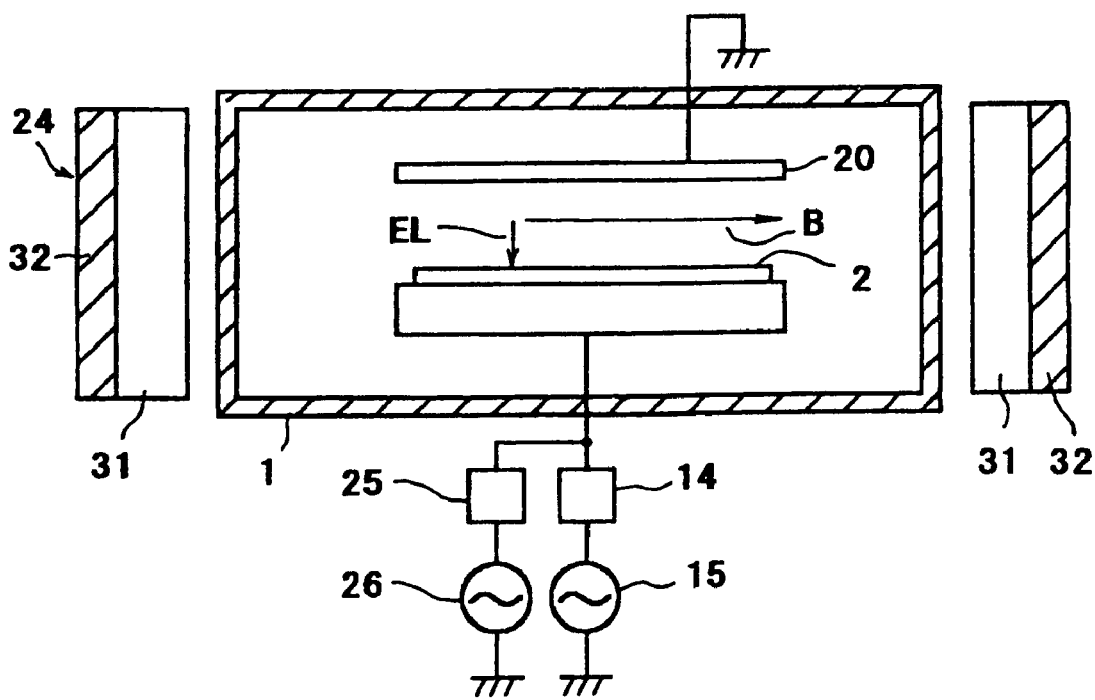
FIG. 3 is a schematic sectional view of assistance in explaining an electric field and a magnetic field to be created in the processing chamber of the plasma-assisted etching system shown in FIG. 1.
Figure 4:
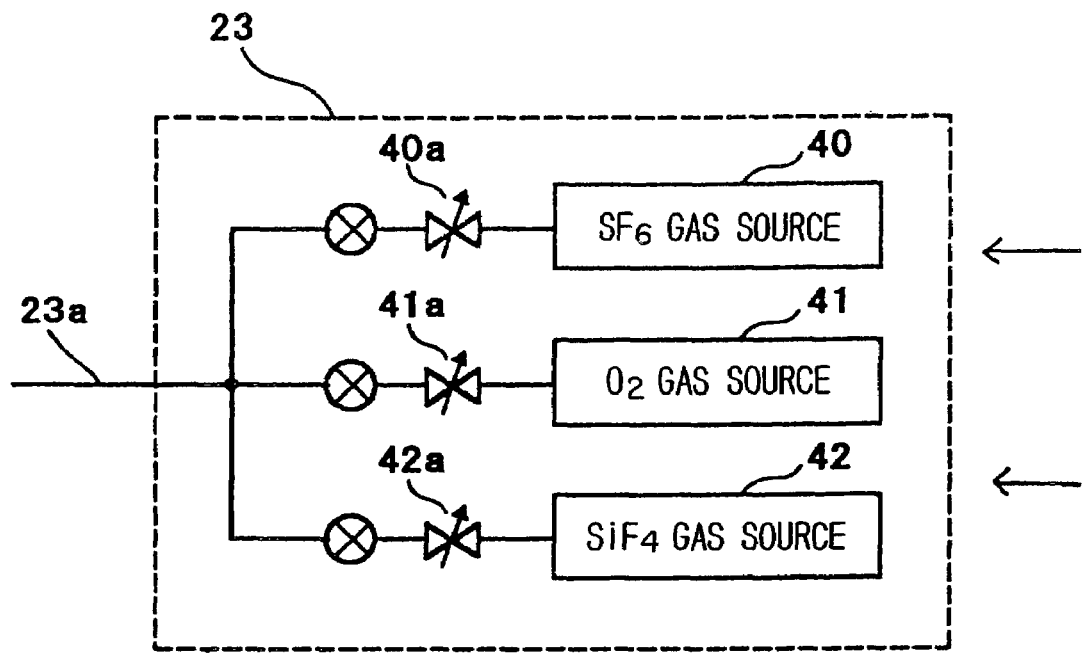
FIG. 4 is a view of a process gas supply system included in the plasma-assisted etching system shown in FIG. 1.

As shown typically in FIG. 3, the first RF power source 15 creates a vertical RF electric field EL and the dipole magnetic ring 24 creates the horizontal magnetic field B in a space between the susceptor 2 and the showerhead 20. Preferably, the magnetic flux density of the horizontal magnetic field B is 100 G (Gauss) or above, more preferably, 170 G or above. A high-density plasma is generated near the surface of the susceptor 2 by magnetron discharge caused by the agency of the electric field EL and the magnetic field B perpendicular to each other.

When the RIE system is used for Si etching, the gate valve 13 is opened, a Si wafer W to be processed is carried into the processing vessel 1, the Si wafer W is placed on the susceptor 2 held at a lower position, and the gate valve 13 is closed. Then, the susceptor 2 is lifted up to an upper position shown in FIG. 1, and the vacuum pump of the exhaust system is actuated to evacuate the processing vessel 1 by sucking out gases through the discharge port 11. Then, the etching gas supply system 23 supplies process gases at predetermined flow rates into the processing vessel 1 such that the pressure in the processing vessel is adjusted to a designated pressure. The first RF power source 15 supplies RF voltage to the susceptor 2 so that RF power is coupled between the susceptor 2 and the showerhead 20 to form RF field of predetermined power flux density between the susceptor 2 (i.e., lower electrode) and the showerhead 20 (i.e., upper electrode). The DC power source 16 applies a DC voltage to the electrode 6a of the electrostatic chuck 6 to hold the Si wafer W firmly on the susceptor 2. Magnetron discharge ionizes an etching gas sprayed by the showerhead 20 to generate a plasma. Radicals and ions contained in the plasma etch the Si wafer W.

The Si etching method of the present invention uses a mixed etching gas prepared by mixing fluorosulfur, such as $SF_6$, or fluorocarbon, $O_2$, and fluorosilicon, such as $SiF_4$. Therefore, the etching gas supply system 23 has a $SF_6$ gas source 40, an $O_2$ gas source 41 and a $SiF_4$ gas source 42. The respective flow rates of $SF_6$ gas, $O_2$ gas $SiF_4$ gas are controlled individually by flow control valves 40a, 41a and 42a.

The below-mentioned experiments were made to prove the advantages of the present invention. All of the experiments were carried out by using the RIE system shown in FIG. 1.

First Experiment

The effect of addition of $SiF_4$ gas to a $SF_6/O_2$ mixed gas on increasing Si etch selectivity was examined through experiments conducted under the following etching conditions.

The diameter of the Si wafer to be etched was 8 inches. A $SiO_2$ film deposited on the wafer by CVD process was used as a mask. $SF_6$ gas, $O_2$ gas and $SiF_4$ gas (etching gases) were supplied into the processing chamber at 150 sccm, 90 sccm, and 0 to 350 sccm, respectively. The pressure in the processing vessel was maintained at 170 millitorr. RF Power supplied by the first RF power source was 1400 W (power flux density: 4.48 W/cm$^2$), and the frequency thereof was 40 MHz. He (Helium) gas was supplied between the upper surface of the electrostatic chuck and the lower surface of the wafer such that the back pressures at the center portion of the wafer and at the edge portion of the wafer were 15 torr and 40 torr, respectively. Distance between the upper and lower electrodes was 37 mm. Temperatures of the lower electrode (susceptor), the upper electrode (showerhead) and the vessel side wall were −15° C., 40° C. and 40° C., respectively. The etching time was 60 seconds.

Figure 5:
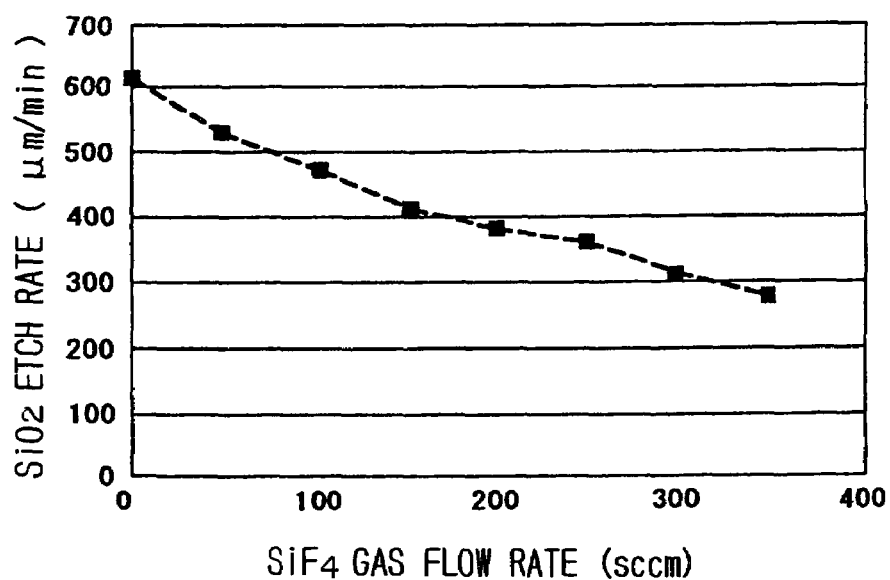
FIG. 5 is a graph showing dependence of etch rate at which a SiO$_2$ film (mask) is etched on the flow rate of SiF$_4$ gas obtained by the first Experiment.
Figure 6:
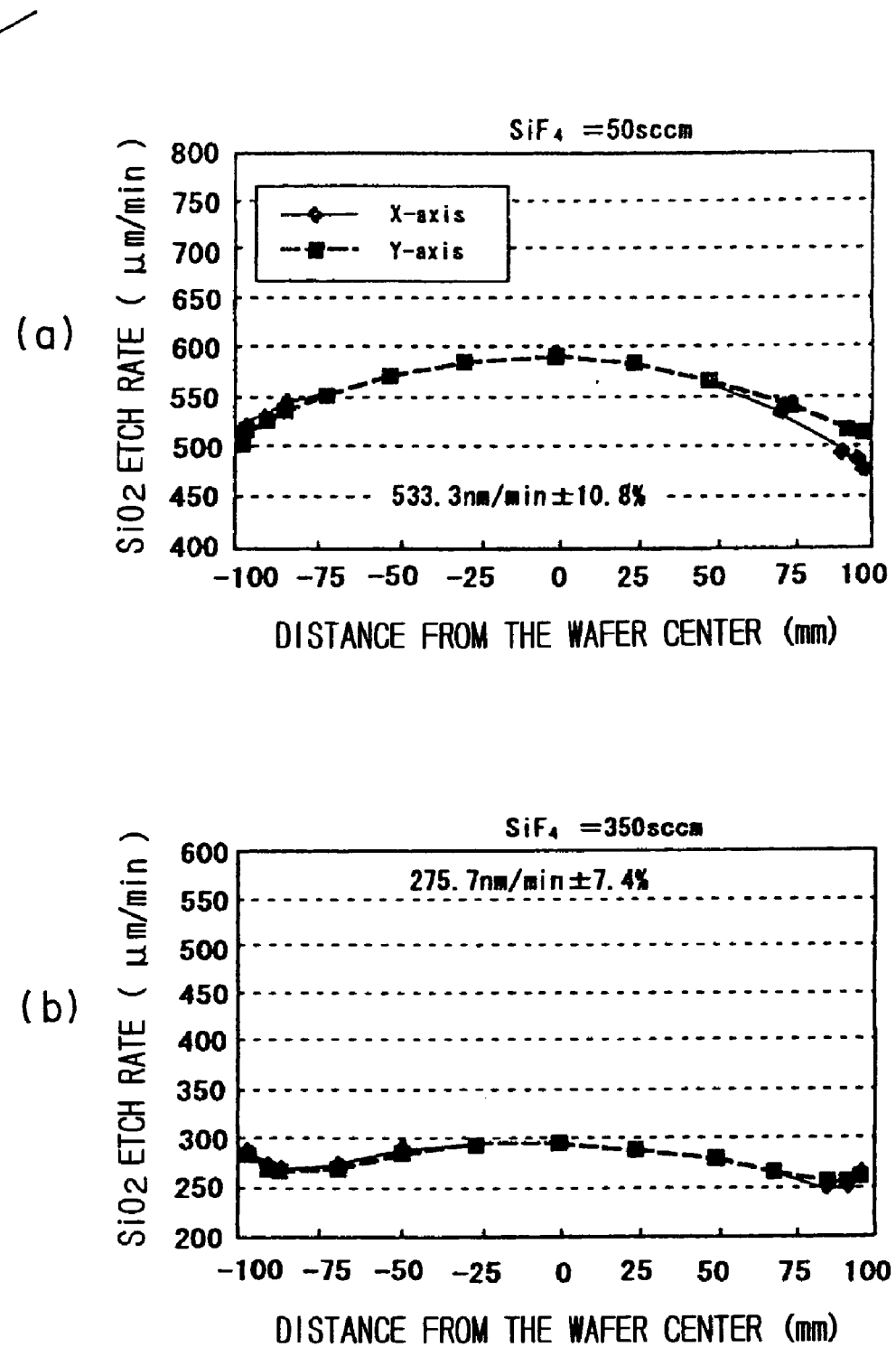
FIGS. 6(a) and 6(b) are graphs showing the variation of etch rate at which SiO$_2$ film (mask) is etched with distance from the center of a wafer obtained by the first Experiment.

Results of the experiments are shown in FIGS. 5 and 6. As obvious from FIGS. 5 and 6, as the SiF$_4$ concentration of a SF$_6$/O$_2$/SiF$_4$ mixed gas increases at least in the SiF$_4$ gas flow rate range of 0 to 350 sccm, mask etch rate (SiO$_2$ etch rate) decreases substantially linearly, and the uniformity of mask etch rate across the surface of the Si wafer W is improved. It is inferred that the reaction of Si atoms dissociated from SiF$_4$ in the plasma with oxygen molecules or oxygen radicals deposits a protective oxide film (SiO$_x$ film) on the mask (SiO$_2$ film), and that the deposition rate of the oxide film (SiO$_x$ film) increases and the protective effect of the oxide film enhances as the SiF$_4$ concentration increases. The effect of addition of SiF$_4$ gas to the SF$_6$/O$_2$ mixed gas on Si etch rate is insignificant and decreases Si etch rate slightly. Therefore, the Si etch selectivity can be increased in proportion to the increase of the SiF$_4$ flow rate at least in the range of 0 to 350 sccm relative to those of the other gases mentioned above.

Second Experiment

In this experiment, the effect of the flow rate ratio SF$_6$/O$_2$/SiF$_4$ of the SF$_6$/O$_2$/SiF$_4$ mixed etching gas (particularly, the change in the flow rates of SF$_6$ gas and O$_2$ gas) on the etching characteristics was examined.

Si wafers of 6 inches diameter, on each of which a mask of SiO$_2$ film had been deposited by CVD process, were prepared. The mask thickness was 2 μm. The aperture ratio of the mask was 5%.

A plasma-assisted trench etching process was performed to form cylindrical trenches (holes) with a diameter of 5 μm and a depth of about 30 μm in each of the Si wafers under the following conditions.

The pressure in the processing vessel was maintained at 250 millitorr. RF Power supplied by the first RF power source was 1200 W (power flux density: 6.8 W/cm$^2$), and the frequency thereof was 40 MHz. He (Helium) gas was supplied between the upper surface of the electrostatic chuck and the lower surface of the wafer such that the back pressures at the center portion of the wafer and at the edge portion of the wafer were 7 torr and 40 torr, respectively. Distance between the upper and lower electrodes was 37 mm. Temperatures of the lower electrode, the upper electrode and the vessel side wall were −10° C., 40° C. and 40° C., respectively. The etching time was 120 seconds.

In the Example A1 to A6, SF$_6$ gas, O$_2$ gas and SiF$_4$ gas (etching gases) were supplied into the processing vessel at 200 to 600 sccm, 40 to 240 sccm, and 250 seem, respectively, as shown in FIG. 7.

In the Comparative example a1, the flow rates of SF$_6$ gas and O$_2$ gas supplied into the processing vessel were 400 sccm and 75 sccm, respectively.

Figure 9:
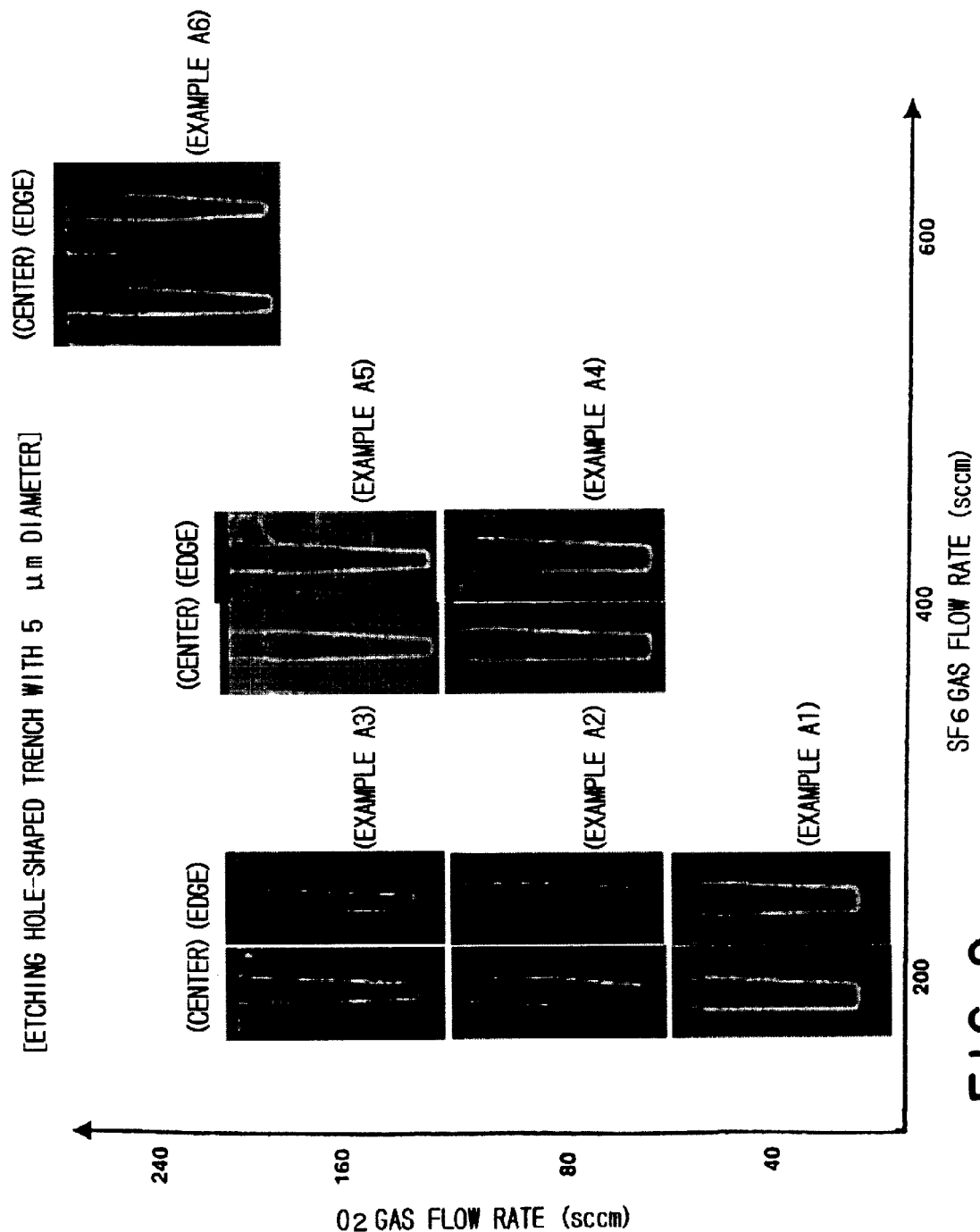
FIG. 9 shows SEM photographs of sections of Si wafers etched by the Si etching method in Examples A1 to A4 in the second Experiment.
Figure 11:
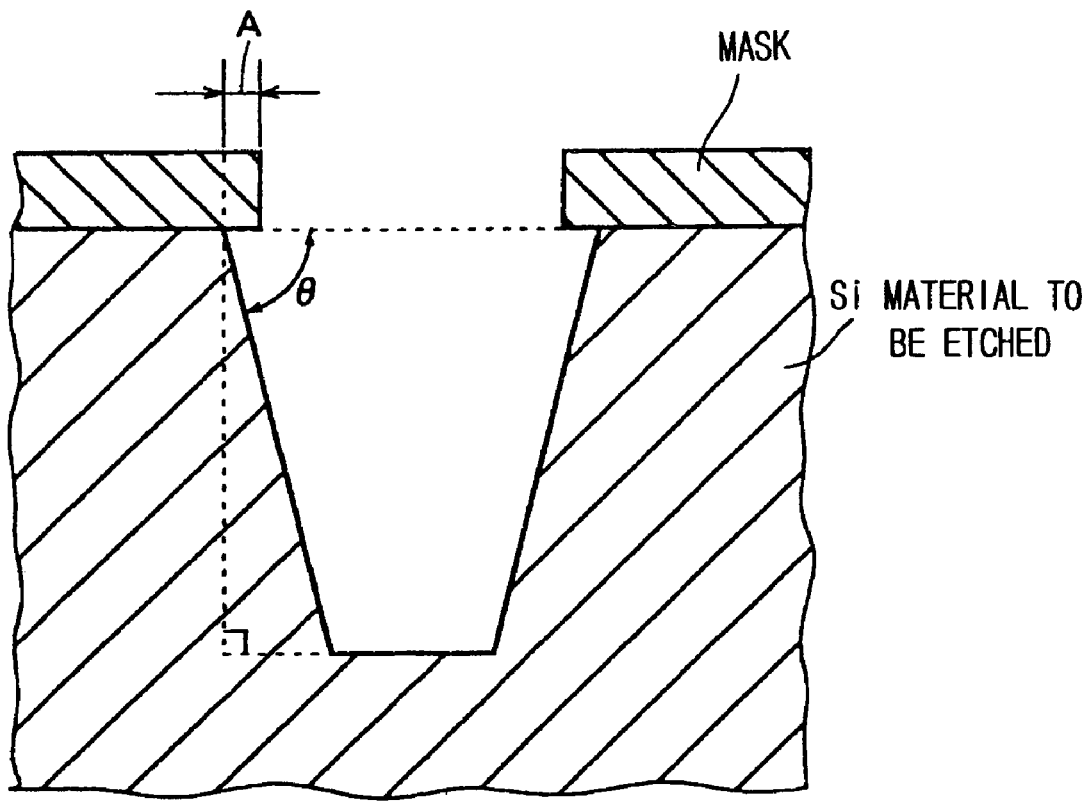
FIG. 11 is a typical sectional view of assistance in explaining the definition of undercut and taper angle.

Etching characteristics of the Si etching methods in Comparative example a1 and Examples A1 to A6 were evaluated by using Si etch selectivity, i.e., the ratio of Si etch rate (Si E/R) to mask etch rate (SiO$_2$ E/R), undercut and taper angle as parameters. Measured data are shown in FIG. 7. FIG. 8 shows photographs of secondary electron images taken by a scanning electron microscope (hereinafter referred to as "SEM photograph") of sections of the Si wafer etched by the Si etching method in Comparative example a1. FIG. 9 is SEM photographs of sections of the Si wafers etched by the Si etching methods in Examples A1 to A6. In FIG. 9, the SEM photographs are arranged at positions on the graph so as to correspond to the process conditions (flow rates of the gases). FIG. 10 is enlarged SEM photographs of sections of the Si wafers etched by the Si etching method in Examples A3 and A2. In FIGS. 7 to 10, a measuring point denoted by "edge" is at 10 mm from the tip of the notch formed in the Si wafer toward the center of the Si wafer. FIG. 11 is a typical sectional view of assistance in explaining the definition of undercut (A) and taper angle (θ).

As obvious from FIGS. 7 and 8, with Comparative example a1, both the Si wafers and the SiO$_2$ mask are etched at high etch rates, and thus a Si etch selectivity is about 30, which is not so high. With Comparative example a1, undercuts were formed on the side walls of the holes in the vicinity of the mask.

As obvious from FIGS. 7, 9 and 10, the etch rate of the Si wafers in Examples A1 to A6 were somewhat lower than the etch rate of the Si wafer in Comparative example a1. However, the etch rate of the SiO$_2$ mask in Examples A1 to A6 was considerably lower than the etch rate of the SiO$_2$ mask in Comparative example a1. Thus, the etching methods in Examples A1 to A6 had improved Si etch selectivities, and were less liable to form undercuts, as compared with the method in Comparative examples.

The Si etching method in Example A3 (SF$_6$/O$_2$/SiF$_4$: 200/160/250 (sccm), i.e., SiF$_4$ gas flow rate/ total flow rates of the etching gases gas=41%) was the most excellent in Si etch selectivity and anisotropic etching capability. Effect in improving Si etch selectivity and undercut prevention is unsatisfactory when the ratio of O$_2$ gas to SF$_6$ gas is excessively low, such as 0.2 or below, as in the Si etching methods in Examples A1 and A4. It is inferred that the amount of oxygen molecules and oxygen radicals is insufficient for forming satisfactory protective films on the mask and the sidewalls when the O$_2$ concentration is low. The respective flow rates of SF$_6$ gas, O$_2$ gas and SiF$_4$ gas of 200 to 600 sccm, 40 to 240 sccm and 250 sccm used by the Si etching methods in Examples A1 to A6 can be reduced to flow rate ratios of (0.8 to 2.4)/(0.16 to 0.96)/1.

As apparent from the measured data, when forming cylindrical trenches (holes) with a diameter of 5 μm, Si can be etched at high etch rates and both Si etch selectivity and anisotropic etching capability can be improved when SF$_6$ gas, O$_2$ gas and SiF$_4$ gas of the mixed etching gas are supplied at the flow rates of 200 to 600 sccm, 40 to 240 sccm and 250 sccm (most preferably, about 200 sccm, 160 sccm and 250 sccm), respectively, namely, at flow rate ratios of (0.8 to 2.4)/(0.16 to 0.96)/1 (most preferably, about 0.8/0.64/1).

Third Experiment

In this experiment, the etching characteristics when forming holes of different size from those examined in Second Experiment were examined. Si wafers of 6 inch diameter, on each of which a mask of SiO$_2$ film had been deposited by CVD process, were prepared. The mask thickness was 2 μm. The aperture ratio of the mask was 5%. A plasma-assisted trench etching process was performed to form cylindrical trenches (holes) with a diameter of 20 μm and a depth of about 40 μm in each of the Si wafers.

In this experiment, the etching conditions in Example B1 to B6 were identical to those in Example A1 to A6 (see Experiment 2), respectively, and the etching conditions in Comparative example b1 were identical to those of Comparative example a1 (see Experiment 2).

Figure 14:
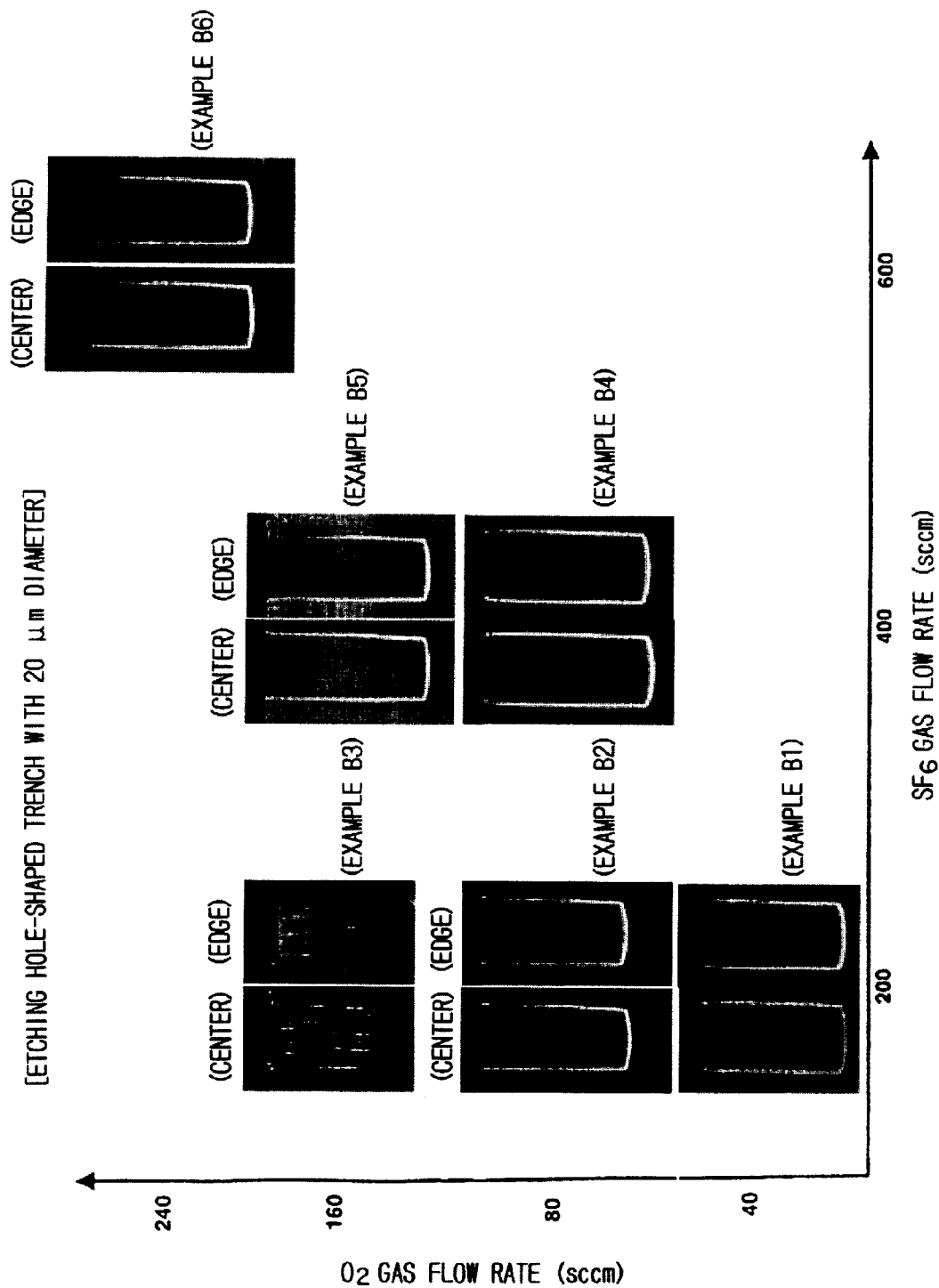
FIG. 14 shows SEM photographs of sections of Si wafers etched by the Si etching method in the Examples B1 to B6 in the third Experiment.

FIG. 12 is a table showing measured data, on Si etch rate (Si E/R), mask etch rate ($SiO_2$ E/R), Si etch selectivity ((Si E/R)/($SiO_2$ E/R)), undercut and taper angle, in Comparative example b1 and Examples B1 to B6. FIG. 13 is SEM photographs of sections of Si wafers etched by the Si etching method in Comparative example b1. FIG. 14 is SEM photographs of sections of Si substrates etched by the Si etching method in Examples B1 to B6. FIG. 15 is enlarged SEM photographs of sections of Si substrate etched by the Si etching method in Examples B3 and B2.

It is known from the comparative examination of data shown in FIG. 7 obtained when 5 µm diameter holes were formed and that shown in FIG. 12 obtained when 20 µm diameter holes were formed that whereas Si etch rate (Si E/R) increases with the increase of the diameter of holes, mask etch rate ($SiO_2$ E/R) is independent of the diameter of holes.

Consequently, Si etch selectivity increases with the increase of the diameter of holes. As shown in FIGS. 12 and 13, the Si etching method in Comparative example b1 formed undercuts of magnitudes greater than that of undercuts formed by the Si etching method in Comparative example a1. Such a result is inferred to be due to the increase in oblique ions bombardment on the sidewalls of the holes with the increase of the diameter of the holes.

As shown in FIGS. 12, 14 and 15, the Si etching methods in Examples B1 to B6 did not form any undercuts. The Si etch selectivity in Example B2 ($SF_6/O_2/SiF_4$: 200/80/250 (sccm), i.e., $SiF_4$ gas flow rate/total flow rates of the etching gases gas=47%) is far greater (by about 26% to 35%) than that in Comparative example b1.

As shown in FIGS. 14 and 15, columnar residues remained in the holes formed by the Si etching method in Example B3. Such a result is considered to be due to the masking effect of minute nonvolatile substances, such as oxides, remaining on the surfaces of the holes on the underlying Si surface that occurs when the $O_2/SF_6$ ratio is excessively high.

Actually, in Example B3, the $O_2/SF_6$ flow ratio is 0.8. When the $O_2/SF_6$ flow rate ratio is decreased by increasing the flow rate of $SF_6$ gas, any columnar residues do not remain in the holes (see Example B5). On the contrary, when the $O_2/SF_6$ flow rate ratio is excessively low, such as 0.2 in Example 4, sidewall protecting films cannot sufficiently grow on the middle and bottom surfaces of the hole, and the cross-section of the hole is tend to be a "bowing" shape or an "inversely-tapered" shape.

It was found that Si etching at a high etch rate could be achieved, Si etch selectivity could be improved, and anisotropic etching capability could be enhanced by supplying $SF_6$ gas, $O_2$ gas and $SiF_4$ gas at flow rates of 200 to 600 sccm, 40 to 200 sccm and 250 sccm, more preferably, about 20 sccm, 80 sccm and 250 sccm, respectively, that is, when the flow rate ratio $SF_6/O_2/SiF_4$ is in the range of (0.8 to 2.4)/0.16 to 0.96)/1, more preferably, about 0.8/0.32/1, for trench etching to form 20 µm diameter holes.

It should be noted that the above flow rate ratio $SF_6/O_2/SiF_4$ is effective not only in trench etching foRForming holes of diameters in the range of 5 to 20 µm, but also in trench etching for forming holes of diameters of 5 µm or below and 20 µm or above, although the above description is not mentioned this.

Fourth Experiment

In this Experiment, the effect of RF power and the pressure in the processing vessel (pressure of the gas) on etching characteristic was examined.

Si wafers of 6 inch diameter, on each of which a mask of $SiO_2$ film had been deposited by CVD process, were prepared. The mask thickness was 2 µm. The aperture ratio of the mask was 5%.

A plasma-assisted trench etching process was performed to form cylindrical trenches (holes) with a diameter of 5 µm and a depth of about 30 µm in each of the Si wafers under the following conditions.

The respective flow rates of $SF_6$ gas, $O_2$ gas and $SiF_4$ gas supplied into the processing vessel were 200 sccm, 160 sccm and 250 sccm, respectively. The frequency of the RF power supplied by the first RF power source was 40 MHz. He (Helium) gas was supplied between the upper surface of the electrostatic chuck and the lower surface of the wafer such that the back pressures at the center portion of the wafer and at the edge portion of the wafer were 7 torr and 40 torr, respectively. Distance between the upper and lower electrodes was 37 mm. Temperatures of the lower electrode, the upper electrode and the vessel side wall were −10° C., 40° C. and 40° C., respectively. The etching time was 120 seconds.

The pressure in the processing vessel was 250 to 450 millitorr. RF Power supplied by the RF power source was 1200 W to 2200 W (power flux density: 6.8 to 12.5 W/cm$^2$).

Figure 17:
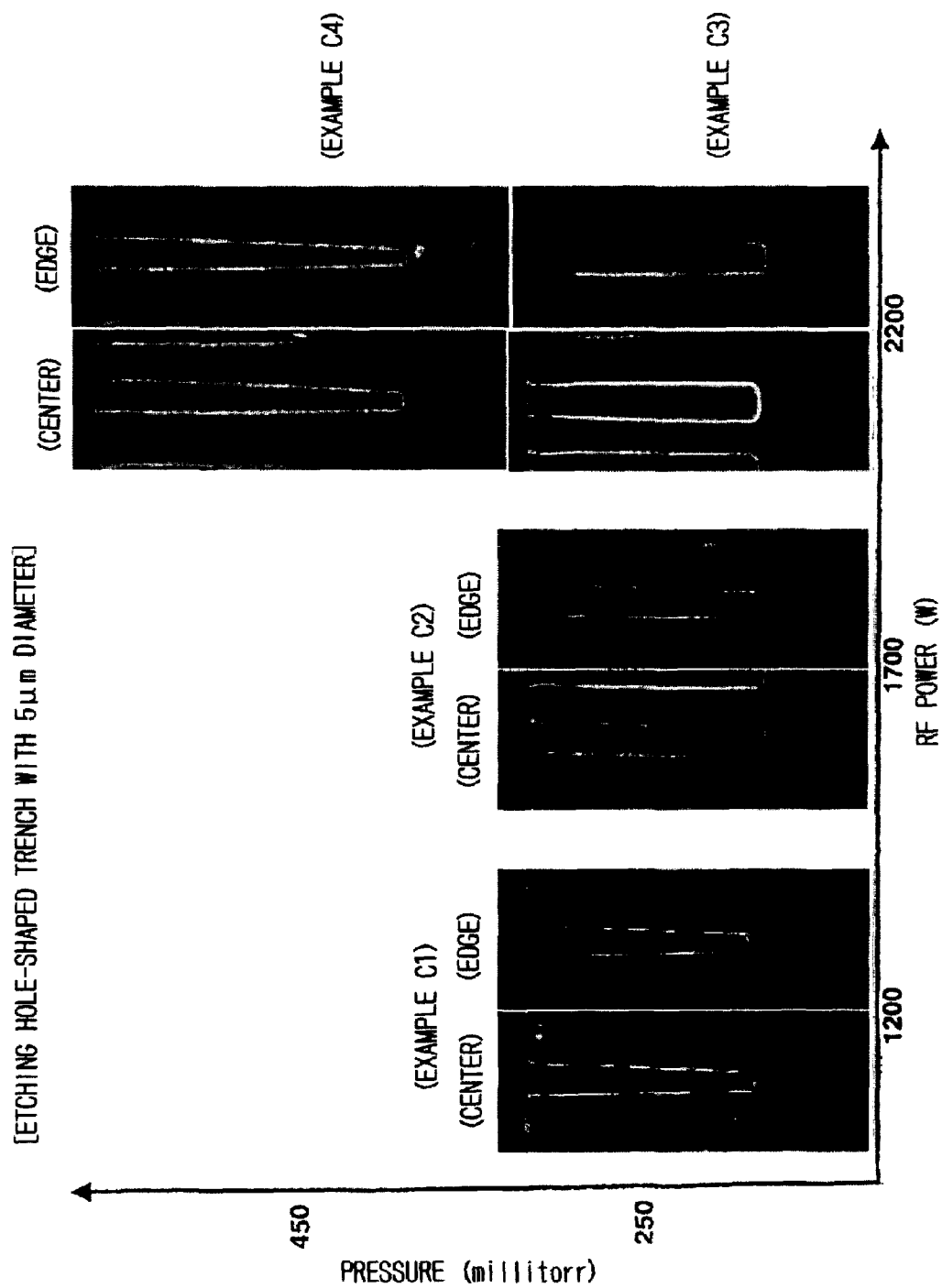
FIG. 17 shows SEM photographs of sections of Si substrates etched by the Si etching method in the Examples B1 to B6 in the fourth Experiments.

FIG. 16 is a table showing the etching conditions (pressure and RF power) in Examples C1 to C4 and the measured data on etching characteristics respectively corresponding thereto. FIG. 17 is SEM photographs of sections of Si wafers etched by the Si etching methods in Examples C1 to C4.

As obvious from measured data relating with Examples C1 to C3 shown in FIGS. 16 and 17, Si etch rate and Si etch selectivity do not change much and taper angle tends to increase with the increase of RF power from 1200 W via 1700 W to 2200 W when the pressure in the processing vessel is kept at 250 millitorr.

It is known from measured data relating with Example C4, both Si etch rate and Si etch selectivity increase greatly while the taper angle being kept at 90 deg or below when RF power is increased to 2200 W and the pressure is increased to 450 millitorr.

It should be noted that the pressure in the processing vessel may be increased to a level on the order of 10 torr, although not mentioned above.

Thus, it is known from the measured data that Si etch rate, Si etch selectivity and taper angle in trench etching for forming 5 µm diameter holes in the Si substrate can be controlled and optimized by correlatively controlling both RF power and gas pressure.

Fifth Experiment

In this experiment, the etching characteristics when forming holes of different size from those examined in Second Experiment were examined. Si wafers of 6 inch diameter, on each of which a mask of $SiO_2$ film had been deposited by CVD process, were prepared. The mask thickness was 2 µm. The aperture ratio of the mask was 5%. A plasma-assisted trench etching process was performed to form cylindrical trenches (holes) with a diameter of 20 µm and a depth of about 40 µm in each of the Si wafers.

In this experiment, the etching conditions in Example D1 to D4 were identical to those in Example C1 to C4 (see 3rd Experiment), respectively.

Figure 19:
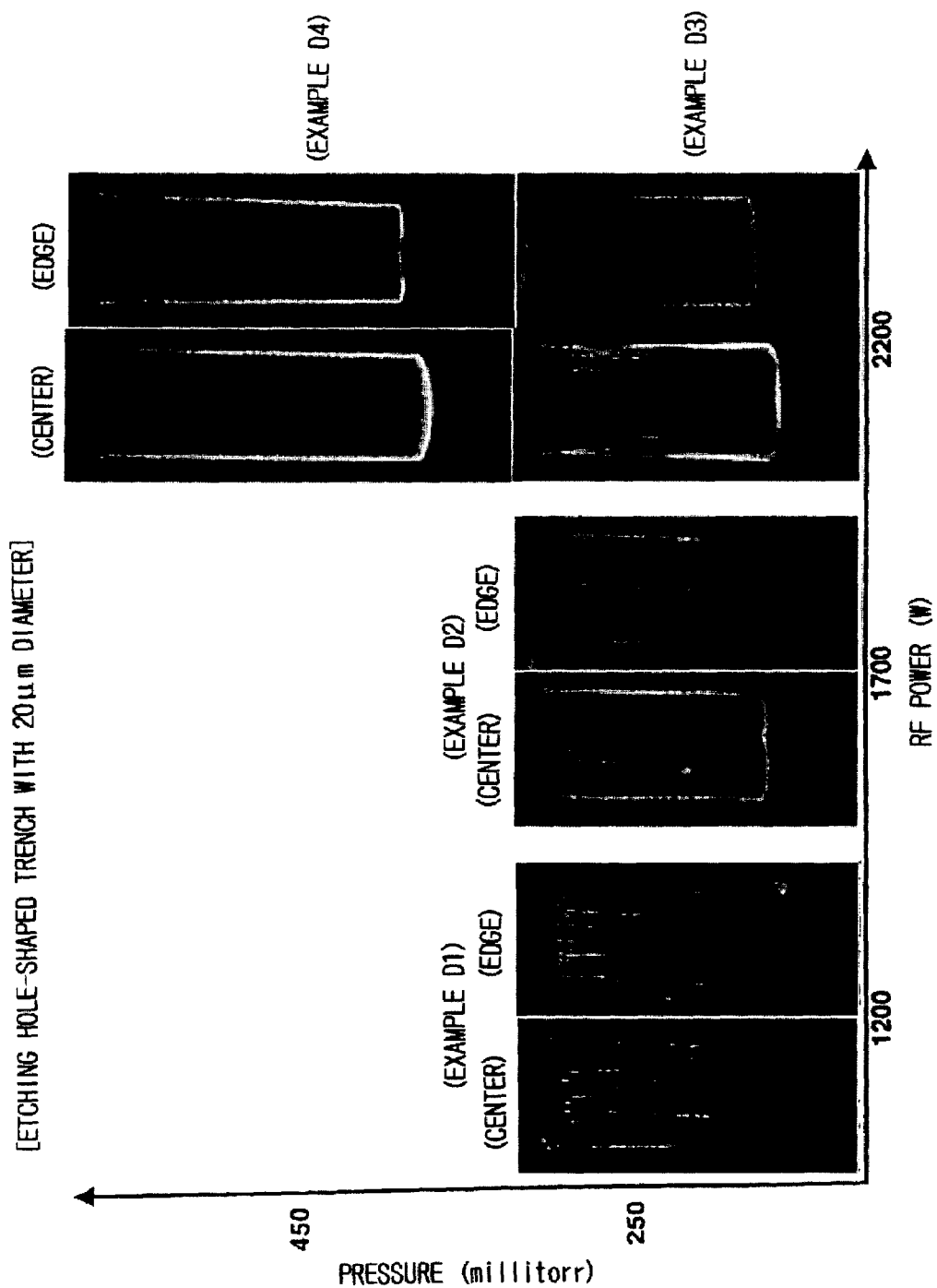
FIG. 19 shows SEM photographs of sections of Si substrates etched by the Si etching method in the Examples D1 to D4 in the fifth Experiments.

FIG. 18 is a table showing the etching conditions (pressure and RF power) in Examples D1 to D4 and the measured data on etching characteristics respectively corresponding thereto. FIG. 19 is SEM photographs of sections of Si wafers etched by the Si etching methods in Examples D1 to D4.

As obvious from measured data relating with Examples D1 to D3 shown in FIGS. 18 and 19, Si etch rate and Si etch selectivity increased in proportion to RF power and columnar residues decreased when RF power was increased from 1200 W via 1700 W to 2200 W with the pressure in the processing vessel kept at 250 millitorr.

Such an effect on promoting Si etching is inferred to be due to the increase of plasma density or the increase of radicals, particularly, fluorine radicals, and the resultant increase of etch rate in forming holes of greater diameters. Although taper angle increases or a tendency of inverse tapering grows as RF power increases in forming 20 μm diameter holes by trench etching, holes having normal taper angles can be formed at high etch rate in a high Si selectivity when the pressure is increased to 450 millitorr (see Example D4).

Thus, it is known from the measured data that Si etch rate, Si etch selectivity and taper angle in trench etching foR-Forming 20 μm diameter holes in the Si substrate can be controlled and optimized by correlatively controlling both RF power and gas pressure.

Sixth Experiment

In this Experiment, the effect of RF power and the pressure in the processing vessel (pressure of the gas) on etching characteristic, in the event that a resist film is used as the mask, was examined.

Si wafers of 6 inch diameter, on each of which a mask of resist film had been coated, were prepared. The mask thickness was about 5 μm.

A plasma-assisted trench etching process was performed to form cylindrical trenches (holes) with a diameter of 3 μm and a depth of about 23 μm in each of the Si wafers under the following conditions.

He (Helium) gas was supplied between the upper surface of the electrostatic chuck and the lower surface of the wafer such that the back pressures at the center portion of the wafer and at the edge portion of the wafer were 10 torr and 30 torr, respectively. Distance between the upper and lower electrodes was 37 mm. Temperatures of the lower electrode, the upper electrode and the vessel side wall were −10° C., 40° C. and 40° C., respectively. The etching time was appropriately changed within the range of 100 to 200 seconds in response to changes in the other etching conditions so that holes (trenches) of the same depth were formed by the etching methods in Examples F1 to F5.

In this Experiment, $SF_6$ gas, $O_2$ gas and $SiF_4$ gas (etching gases) were supplied into the processing vessel at 500 sccm, 120 or 180 sccm, and 250 seem, respectively, as shown in FIG. 20. The pressure in the processing vessel was from 130 to 350 millitorr. RF Power supplied by the first RF power source was from 450 to 1000 W (power flux density: 2.55 to 5.67 W/cm²), and the frequency thereof was 40 MHz.

FIG. 20 is a table showing the etching conditions (pressure, RF power and $O_2$ gas flow rate) in Examples F1 to F4 and the measured data on etching characteristics respectively corresponding thereto.

As obvious from FIG. 20, as both the RF power and the pressure in the processing vessel increased, both the etch rate of Si wafer and the etch rate of the resist mask increased. However, the increase in the etch rate of the Si wafer was greater than that of the resist film, thus the Si etch selectivity was improved as both the RF power and the pressure in the processing vessel increases.

However, if the RF power is excessively high, the cross-section of the hole is tend to be a "bowing" shape or an "inversely-tapered" shape. If the pressure in the processing vessel is excessively high, the cross-section of the hole is tend to be a "bowing" shape or an "inversely-tapered" shape, and the uniformity of the Si etch rate in one Si wafer is reduced.

With respect to the above, it is concluded that the optimum RF power when using a resist mask is lower than that when using a $SiO_2$ mask, and that the optimum RF power is in the range of 450 to 1000 W (power flux density: 2.55 to 5.67 W/cm²) and the optimum pressure in the processing vessel is in the range of 150 to 450 millitorr when using a resist mask.

As obvious from the comparison between Examples 3 and 4, as the flow rate of $O_2$ gas increased, both the etch rate of Si wafer and the etch rate of the resist mask increased. However, the increase in the etch rate of the Si wafer was greater than that of the resist film, thus the Si etch selectivity was improved as both the RF power and the pressure in the processing vessel increases. In addition, there is a tendency that the larger flow rate of $O_2$ gas results in a hole of a "bowing" shape and the smaller flow rate of $O_2$ gas results in a hole of an "inversely-tapered" shape. Thus, it is concluded that a hole of the optimum shape can be obtained by appropriately determining the flow rate of $O_2$ gas.

Seventh Experiment

This experiment relates to formation of grooves (trenches). In this experiment, the effect of the flow rates of $SF_6$ gas, $O_2$ gas and $SiF_4$ gas (particularly, the flow rate of $SiF_4$ gas), RF power and the pressure in the processing vessel (pressure of the gas), as parameters, on etching characteristic was examined.

Si wafers of 8 inch diameter, on each of which a mask of $SiO_2$ mask had been coated, were prepared. The mask thickness was about 2 μm.

A plasma-assisted trench etching process was performed to form grooves with a width of 1.2 μm, lengths in the range of 1 to 10 μm and a depth of about 6 μm in each of the Si wafers under the conditions recited in Tables 21 to 23.

The other conditions not recited in Tables 21 to 23 are that the frequency of RF power was 40 MHz, the distance between the upper and lower electrodes was 37 mm, and temperatures of the lower electrode, the upper electrode and the vessel side wall were −10° C., 40° C. and 40° C., respectively.

It is known from the comparative examination of measured data relating with Examples E1 to E3 shown in FIG. 21 and measured data relating with Comparative examples e1 to e3 shown in FIG. 20 that, whereas the addition of $SiF_4$ gas to the $SF_6/O_2$ mixed gas does not have a significant effect on Si selectivity, the addition of $SiF_4$ gas increases Si etch rate in forming the 1.2 μm wide trenches. As obvious from data relating with Examples E2 and E3, the increase of both the pressure and the RF power has a significant effect on increasing Si etch rate greatly.

It is known from the comparative examination of data relating with Examples E2 and E3, in which the flow rate of $SiF_4$ gas was 50 sccm, shown in FIG. 21, and data relating with Examples E4 and E5, in which the flow rate of $SiF_4$ is 350 sccm, shown in FIG. 22 that the increase of the flow rate of $SiF_4$ decreases Si etch rate slightly and increases Si etch selectivity greatly. Such an effect of a high flow rate of $SiF_4$ results because SiO$_2$ etch rate (mask etch rate) decreases in inverse proportion to the increase of the flow rate of SiF$_4$, which is similar to the aforesaid effect of the Si etching method in the first embodiment. The Si etching method in Example E4, in which the flow rate of O$_2$ gas is 90 sccm, is superior to the Si etching method in Example E5, in which the flow rate of O$_2$ gas is 100 sccm, in both Si etch selectivity and Si etch rate.

In Examples E1 to E5, the SF$_6$/O$_2$/SiF$_4$ flow rate ratio between the flow rate of SF$_6$ gas of 150 sccm, the flow rate of O$_2$ gas between 90 and 100 sccm and the flow rate of SiF$_4$ gas between 50 and 350 sccm is 1/(0.6 to 0.67)/(0.33 to 2.33). The magnitudes of RF power in the range of 650 to 200 W used by the Si etching method in Examples E1 to E5 correspond to power flux densities in the range of 2.0 to 6.4 W/cm$^2$. RF power as low as 500 W (1.5 W/cm$^2$) is effective.

The aforementioned preferable etching conditions according to the present invention may be used, exactly as they are or with some modification, foRForming the trenches with the dimensions (diameter, width, depth etc.) different from those described in the foregoing Experiments 1 to 6.

For example, the etching conditions of Examples A1 to A6 (see 2nd Experiment), Examples B1 to B6 (see 3rd Experiment), Examples C1 to C4 (see 4th Experiment) and Examples D1 to D4 (see 5th Experiment), particularly, the SF$_6$/O$_2$/SiF$_4$ flow rate ratio between the etching gases, the RF power, and the pressure in the processing vessel, are applicable to forming trenches with width of about 3 μm or above and depths of 20 μm or below in Si substrates or Si layers with Si O$_2$ masks formed thereon. The etching conditions of Examples F1 to F6 (see 6th Experiment) is also applicable to forming trenches with width of about 3 μm or above and depths of 20 μm or below in Si substrates or Si layers with resist masks formed thereon.

Etching conditions of Examples E1 to E5 (see 7th Experiment), particularly, the RF power and the pressure in the processing vessel, are applicable to forming trenches with widths of about 3 μm or below and depths of about 15 μm or below in Si substrates or Si layers.

A Si etching method may alternately perform an etching process using the SF$_6$/O$_2$/SiF$_4$ mixed gas used by the Si etching methods of the present invention, and an etching process using the SF$_6$/O$_2$ gas. This Si etching method is able to exercise the effect of the SF$_6$/O$_2$ gas on increasing etch rate and the effect of the SF$_6$/O$_2$/SiF$_4$ mixed gas on the enhancement of Si selectivity and anisotropic etching in combination.

In the aforementioned description, the RIE system with the dipole magnetic ring for creating a magnetic field is employed in carrying out the Si etching method according to the present invention. However, the magnetic field may be created by any suitable means and the creation of the magnetic field is not essential. In addition, any suitable plasma generating mechanism may be used. The plasma generating mechanism is not limited to that of a capacitive coupling type and may be that of an inductive coupling type. The Si etching method of the present invention is applicable to etching any Si substrates and target objects including Si substrates and Si layers.

The Si etching method of the present invention is not limited in its application to forming trenches, but is applicable to forming wiring through holes in fabricating three-dimensional IC devices and MEMSs.

As apparent form the foregoing description, according to the present invention, the Si etching method basically uses the SF$_6$/O$_2$/SiF$_4$ mixed gas for etching, and is capable of improving both Si selectivity and anisotropic etching capability, and of increasing etch rate.

What is claimed is:

1. A method of etching a Si target object, which is a Si substrate or a Si layer formed on a substrate, by using a plasma, said method comprising the steps of:

placing the Si target object, coated with a mask, in a processing vessel;

supplying a mixed etching gas into the processing vessel, the etching gas containing fluorosulfur or fluorocarbon gas, O$_2$ gas and fluorosilicon gas; and applying a first RF voltage having a first frequency of 40 MHz or above to a first electrode to couple RF power from the first electrode to a second electrode in the processing vessel, thereby generating a plasma from the etching gases, wherein said method etches parts of the Si substrate or the Si layer to form holes with diameters of about 3 μm or below and depths of about 15 μm or below, or to form grooves with widths of about 3 μm or below and depths of about 15 μm or below; and the mixed etching gas is supplied into the processing vessel with flow rate ratios between those of fluorosulfur or fluorocarbon gas, O$_2$ gas and fluorosilicon gas being in the range of 1/(0.6 to 0.67)/(0.33 to 2.33).

2. The method according to claim 1, wherein the etching gas has a fluorosilicon volumetric concentration of 10% or above.

3. The method according to claim 1, wherein a ratio of an O$_2$ gas volumetric concentration to a fluorosulfur or fluorocarbon gas volumetric concentration in the etching gas is in the range of 0.2 to 0.8.

4. The method according to claim 1, wherein a pressure in the processing vessel is in the range of 50 millitorr to 10 torr.

5. The method according to claim 1, wherein the processing vessel is provided therein with a susceptor adapted to support the object thereon and serve as the first electrode, and wherein the temperature of an object supporting surface of the susceptor is in the range of −30° C. to 20° C.

6. The method according to claim 1, wherein the first RF power has a power flux density in the range of 1.5 to 6.4 W/cm$^2$.

7. The method according to claim 1, wherein a pressure in the processing vessel is in the range of 50 millitorr to 250 millitorr.

8. The method according to claim 1, wherein the mask comprises a SiO$_2$ film, and the RF power has a power flux density in the range of 6.8 to 12.5 W/cm$^2$.

9. The method according to claim 1, wherein the mask comprises a resist film, and the RF power has a power flux density in the range of 2.55 to 5.67 W/cm$^2$.

10. The method according to claim 1, wherein a pressure in the processing vessel is in the range of 150 millitorr to 450 millitorr.

11. The method according to claim 1, wherein the fluorosulfur gas is supplied into the processing vessel, and the fluorosulfur gas is SF$_6$ gas.

12. The method according to claim 1, wherein the fluorosilicon gas is supplied into the processing vessel, and the fluorosilicon gas is SiF$_4$ gas.

13. The method according to claim 1, wherein a magnetic field is created between the electrodes at least when applying the first RF voltage, and wherein a direction of the magnetic field is perpendicular to a direction of an electric field created between the electrodes by applying the first RF voltage.

14. The method according to claim 13, wherein the magnetic field has a magnetic flux density of 170 G or above.

15. The method according to claim 1, wherein the processing vessel is provided therein with a susceptor adapted to support the object thereon, and a first RF power source is electrically connected to the susceptor to apply the first RF voltage to the susceptor serving as the first electrode.

16. The method according to claim 15, wherein a second RF power source is electrically connected to the susceptor, and the second RF power source applies a second RE voltage having a second frequency lower than the first frequency to the susceptor when the first RF power source applies the first RF voltage to the susceptor.

17. The method according to claim 16, wherein the second frequency is 3.2 MHz.

* * * * *